(12) United States Patent
Rupasov et al.

(10) Patent No.: US 7,076,138 B2
(45) Date of Patent: Jul. 11, 2006

(54) NANOPHOTONIC DEVICES BASED ON QUANTUM SYSTEMS EMBEDDED IN FREQUENCY BANDGAP MEDIA

(75) Inventors: Valery Rupasov, Southbridge, MA (US); Sergei Krivoshlykov, Shrewsbury, MA (US)

(73) Assignee: ALTAIR Center, LLC, Shrewsbury, MA (US)

( * ) Notice: Subject to any disclaimer, the term of this patent is extended or adjusted under 35 U.S.C. 154(b) by 281 days.

(21) Appl. No.: 10/783,069

(22) Filed: Feb. 20, 2004

(65) Prior Publication Data

US 2005/0185686 A1 Aug. 25, 2005

(51) Int. Cl.
*G02B 6/00* (2006.01)
*H01S 3/10* (2006.01)
*H01S 3/00* (2006.01)

(52) U.S. Cl. .................... 385/122; 385/15; 385/129; 385/130; 385/42; 372/21; 359/333; 359/342

(58) Field of Classification Search .............. 385/1, 385/2, 3, 122, 129, 130, 131, 14, 42, 15, 385/16; 372/21; 359/333, 342
See application file for complete search history.

(56) References Cited

U.S. PATENT DOCUMENTS

| | | | | |
|---|---|---|---|---|
| 6,710,366 B1* | 3/2004 | Lee et al. | | 257/14 |
| 6,900,920 B1* | 5/2005 | Chang-Hasnain et al. | .. | 359/244 |
| 6,959,127 B1* | 10/2005 | Zoorob | | 385/16 |
| 6,961,499 B1* | 11/2005 | Lee et al. | | 385/122 |
| 2003/0076865 A1* | 4/2003 | Chang-Hasnain et al. | .... | 372/46 |
| 2004/0001665 A1* | 1/2004 | Zoorob | | 385/16 |
| 2004/0036130 A1* | 2/2004 | Lee et al. | | 257/409 |
| 2004/0126072 A1* | 7/2004 | Lee et al. | | 385/122 |
| 2005/0017260 A1* | 1/2005 | Lee | | 257/101 |
| 2005/0100296 A1* | 5/2005 | Zoorob | | 385/129 |
| 2005/0185686 A1* | 8/2005 | Rupasov et al. | | 372/43.01 |

* cited by examiner

*Primary Examiner*—Brian M. Healy

(57) ABSTRACT

The present invention describes nanophotonic materials and devices for both classical and quantum optical signal processing, transmission, amplification, and generation of light, which are based on a set of quantum systems having a discrete energy levels, such as atoms, molecules, or quantum dots, embedded in a frequency bandgap medium, such as artificial photonic crystals (photonic bandgap materials) or natural frequency dispersive media, such as ionic crystals, molecular crystals, or semiconductors, exhibiting a frequency (photonic) bandgap for propagating electromagnetic modes coupled to optical transitions in the quantum systems. If the frequency of one of optical transitions, called the working transition, lies inside the frequency bandgap of the medium, then spontaneous decay of the working transition into propagating photon modes is completely suppressed. Moreover, the excitation of the working transition and a photon form a photon-quantum system bound state lying inside the photonic bandgap of the medium, in which radiation is localized in the vicinity of the quantum system. In a quantum system "wire" or a quantum system "waveguide", made of spatially disordered quantum systems, or in a chain quantum system waveguide made of a periodically ordered identical quantum systems, wave functions of the photon-quantum system bound states localized on different quantum systems overlap each other and develop a photonic passband lying inside bandgap of the photonic bandgap medium.

20 Claims, 8 Drawing Sheets

NANOPHOTONIC DEVICES BASED ON QUANTUM SYSTEMS EMBEDDED IN FREQUENCY BANDGAP MEDIA

BACKGROUND OF THE INVENTION

1. Field of the Invention

This invention relates to nanophotonic materials, devices and integrated chips for both classical and quantum optical signal processing based on nanoscale size spatially ordered or disordered structures of quantum systems, such as atoms, molecules, quantum dots, etc, embedded in frequency bandgap media, such as artificial photonic crystals (photonic bandgap materials) or natural ionic crystals, molecular crystals, and semiconductor materials exhibiting a frequency gap in their spectrum of elementary electromagnetic excitations. Preferred embodiments include all-optical nanoscale integrated circuits and such key elements of nanophotonics, as efficient lines of delay, switches, modulators, transistors, linear and nonlinear directional couplers, efficient generators of photons in entangled states, optical amplifiers, lasers, etc., utilizing linear and, especially, unique nonlinear properties of quantum systems in the frequency gap media.

2. Background of the Invention

The label "all-optical" is commonly used to distinguish the devices that do not involve dissipative electronic transport and require essentially no electrical communication of information [D. A. B. Miller, *Optical Computing: Proc. 34th Scottish Universities Summer School in Physics* (Edinburgh, 1988), Eds. B. S. Wherrett and F. A. P. Tooley (Bristol: Hilger)]. The all-optical transistor action was first observed in the context of optical bistability [Gibbs H M 1985 *Optical Bistability: Controlling Light with Light* (New York: Academic)] and consisted in a strong differential gain regime, in which, for small variations in the input intensity, the output intensity has a very strong variation. The emerging competition between all-optical devices and their electronic counterparts brings with it significant practical challenges. The most important demand is related to integration of the all-optical devices. In order to realize an all-optical chip, the individual components should have length scales of the order of 10 micrometers. In order to diminish heating of the chip and operating power and time, the holding power, the switching energy, and switching time should be minimized. The large number of interconnections on an all-optical chip should be insensitive to environmental perturbation and should operate at room temperature.

Most of the all-optical devices for optical signal processing known from the literature are based on optical bistability in a cavity filled either with a nonlinear material taking advantage of such nonlinear optical phenomena as second-harmonic generation, or with a nonlinear optical media exhibiting a strong third-order nonlinearity (Kerr media) [I. E. Protsenko and L. A. Lugiato, *Phys. Rev.* A 50, 1627 (1994)]. The major drawbacks of such all-optical devices are related to their size (most of the devices cannot be scaled down to spatial extensions smaller than 300 µm), their long switching times and their high power requirements. Cavity build-up time, cavity dynamical effects and nonlinear medium response time limit the switching time of the device. For example, by operating very close to a very narrow cavity resonance, the switching threshold can be reduced, whereas cavity build-up time increases dramatically. Consequently the product of the switching threshold and switching time remains unacceptably large. Using materials with relatively large optical nonlinearities also requires a compromise in the response time of the medium. Other physical limitations include the lack of scalability and integrability.

There have been two proposals for unconventional waveguiding systems known from the literature. The first one suggests using ordered cavities [R. D. Meade, A. Devenyi, J. D. Joannopoulos, O. L. Alerhand, D. A. Smith, and K. Kash, *J. Appl Phys.* 75, 4753 (1994); M. Bayindir, B. Temelkuran, and E. Ozbay, *Phys. Rev. Lett.* 84, 2140 (2000)], or defects [V. Yannopapas, A. Modinos, and N. Stefanou, *Phys. Rev.* B 65, 235201 (2002)] in photonic crystals. Low-loss waveguiding in such systems has been already experimentally demonstrated. The second proposal employs so-called chain waveguides, in which surface plasmon polaritons tunnel between ordered metallic nanoparticles [S. A. Maier, P. G. Kik, and H. A. Atwater, *Applied Phys. Lett.* 81, 1714 (2002)]. However, due to fast spontaneous decay of the surface plasmon polaritons, loss in chain waveguides made form the metallic nanoparticles are unacceptably high for practical implementations. Moreover, neither the cavity waveguide in photonic crystals nor the metallic chain waveguides exhibit any essential nonlinear properties, because both the cavities and the nanoparticles are optically passive elements. Therefore, they cannot be used for engineering all-optical devices, where light signal is controlled by another light. Even filling out of the cavities with a nonlinear optical medium could not result in strong nonlinear properties required for all-optical signal processing because of relatively weak optical nonlinearities of conventional nonlinear optical media.

The only practically viable solution of the problem could be taking advantage of an extremely strong optical nonlinearity due to a resonance character of interaction between photons and quantum systems with discrete energy levels [L. Allen and J. Eberly, *Optical Resonance and Two-Level Atoms* (Wiley, New York, 1975)]. Moreover, switching time of the quantum system from one discrete state to another can be obviously extremely short. However, in vacuum or in conventional optical media, an excited state of the quantum system spontaneously decays vary fast into propagating electromagnetic modes that essentially restricts practical implementations of strong resonance nonlinearity in all-optical devices.

This major obstacle of resonance quantum systems could be eliminated if the system is placed into a photonic bandgap media and optical transition frequency of the system lies inside photonic bandgap of the medium [S. John and J. Wang, *Phys. Rev. Lett.* 64, 2418 (1990); V. I. Rupasov and M. Singh, *Phys. Lett.* A 222, 258 (1996)]. In that case the excited state of the transition does not decay, but the photon and quantum system form a bound state, in which radiation is localized in the vicinity of the quantum system.

In the present invention, we demonstrate that the quantum systems and their structures embedded in frequency bandgap media exhibit unique linear and, especially, strong nonlinear optical phenomena, and we propose using their properties in a new class of nanophotonic devices and integrated optical circuits for both classical and quantum optical signal processing, transmission, amplification, and generation of light.

If frequency of one of the optical transitions in a quantum system, which hereafter we call the working transition, lies inside the photonic bandgap of a medium, then spontaneous decay of the working transition into propagating photon modes is completely suppressed. Moreover, excitation of the working transition and a photon form a photon-quantum system bound state with the frequency also lying inside the photonic bandgap of the medium. In the bound state, photon wave function is localized in the vicinity of the quantum system with the radius of localization of one or few wavelengths Λ corresponding to the transition frequency Ω, $\Lambda=2\pi c/\Omega$, where c is the speed of light in vacuum. In other words, for the quantum system having angstrom size the radius of localization of a photon bound to the quantum system may approaches one or several micrometers.

Key element of the proposed nanophotonic devices and integrated circuits is a quantum system waveguide, such as quasi-one-dimensional "wire" made of spatially disordered quantum systems, or a periodically ordered chain of identical quantum systems embedded in the frequency bandgap media. In the quantum system waveguide wave functions of the photon-quantum system bound states localized on different quantum systems overlap each other. Therefore, the bound states are obviously delocalized forming a photonic passband lying inside photonic bandgap of the frequency bandgap medium. Photons with frequencies lying inside the passband propagate along the quantum system waveguide. Since the working transition cannot be excited twice by passband photons, the passband photons interact with each other extremely strongly both in one waveguide and in different waveguides that are located sufficiently closely to each other. We propose to employ these unique nonlinear properties of the quantum system waveguides for development of key nanophotonic devices, such as switches, modulators, transistors, control-NOT logic gates, nonlinear directional couplers, lines of delay, electro-optical modulators and converters, generators of entangled photon states, passband optical amplifiers and lasers, as well as all-optical integrated circuits for both classical and quantum optical signal processing, including quantum computing.

Nanophotonic devices based on quantum system chain waveguides in frequency bandgap media described in the proposed invention have extremely strong optical nonlinear properties, extremely short switching times and low bending loss. The linear and nonlinear optical properties of the quantum system waveguides can be easily adjusted by an appropriate choice of physical and optical parameters of the quantum systems and frequency bandgap media. Moreover, due to resonance character of interaction between optical radiation and quantum systems the passband modes have a large spatial size. Therefore, one can easily achieve low-loss coupling between the quantum system waveguides and conventional waveguides and fibers.

OBJECTS AND SUMMARY OF THE INVENTION

It is an object of the present invention to provide nanophotonic materials, devices and integrated all-optical and electro-optical circuits for both classical and quantum optical signal processing, transmission, amplification, and generation of light based on the set of quantum systems having discrete energy levels, such as atoms, molecules, or quantum dots, embedded in a frequency bandgap medium, such as artificial photonic crystals (photonic bandgap materials), or natural frequency dispersive media, such as ionic crystals, molecular crystals, or semiconductors, exhibiting a frequency bandgap for propagating electromagnetic modes coupled to optical transitions between discrete energy levels in the quantum systems.

Another object is to provide an efficient quantum system waveguide or quantum dot chain waveguide inside the frequency bandgap medium in order to develop a photonic passband within the photonic bandgap of the frequency bandgap medium.

Another object of the invention is to dramatically enhance nonlinearity in the proposed system as required for fabrication of highly efficient electro-optical and nonlinear optical materials for various electro-optical and all-optical devices.

Further object of the invention is to provide high efficiency nanoscale electro-optical modulators and converters transforming electrical signals into optical and operating as switches, modulators, transistors or control-NOT logic gates. Again, due to resonance character of coupling between passband photons and the working transition of quantum systems, the coupling is easily controlled by an electric field applied to the quantum system. Due to the Stark effect in atoms and molecules, or its analog in quantum dots, the applied electric filed shifts the transition frequency, and thus effectively changes propagation of the passband photons in quantum system waveguides.

Still another object of the invention is to provide efficient lines of delay of optical pulses with required group velocity of passband light pulses propagating along the quantum system waveguide.

Another object of the invention is to provide an efficient nonlinear all-optical directional coupler performing coupling between the input signals, splitting of the input signal between two arms or coupling of the signals from one arm to another.

A further object of the invention is to provide nanophotonic materials devices and integrated all-optical and electro-optical circuits for quantum optical signal processing, including efficient generators of photons in entangled states.

An additional object of the invention is to provide efficient electrically or optically pumped lasers or amplifiers for generation or amplification of optical signals propagating in the photonic passband within the forbidden photonic bandgap of the frequency bandgap medium.

Briefly stated, the present invention describes nanophotonic materials and devices for both classical and quantum optical signal processing, transmission, amplification, and generation of light, which are based on a set of quantum systems having a discrete energy levels, such as atoms, molecules, or quantum dots, embedded in a frequency bandgap medium, such as artificial photonic crystals (photonic bandgap materials) or natural frequency dispersive media, such as ionic crystals, molecular crystals, or semiconductors, exhibiting a frequency bandgap for propagating electromagnetic modes coupled to optical transitions in the quantum systems. If the frequency of one of optical transitions, called the working transition, lies inside the frequency bandgap of a medium, then spontaneous decay of the working transition into propagating photon modes is completely suppressed. Moreover, the excitation of the working transition and a photon form a photon-quantum system bound state lying inside the photonic bandgap of the medium, in which radiation is localized in the vicinity of the quantum system. In a one-dimensional quantum system "wire" or a quantum system "waveguide", made of spatially disordered quantum systems, or in a chain quantum system waveguide made of a periodically ordered identical quantum systems, the wave functions of the photon-quantum system bound states localized on different quantum systems overlap each other and develop a photonic passband lying inside photonic bandgap of the frequency bandgap medium. Photons with frequencies lying inside the photonic passband propagate along the quantum system waveguide. Since the working transition cannot be excited twice, the passband photons interact with each other extremely strongly both in one waveguide and in different waveguides that are located sufficiently close to each other. These unique nonlinear properties of the quantum system waveguides are proposed to use for engineering key nanophotonic devices, such as all-optical and electro-optical switches, modulators, and transistors, control-NOT logic gates, nonlinear directional couplers, electro-optical modulators and converters, generators of entangled photon states, passband optical amplifiers and lasers, as well as all-optical integrated circuits for both classical and quantum optical signal processing, including quantum computing.

Further scope of applicability of the present invention will become apparent from the detailed description given hereafter. However, it should be understood that the detailed descriptions and specific examples, while including the preferred embodiments of the invention, are given by way of illustration only, since various changes and modifications within the spirit and scope of the invention will become apparent to those skilled in the art from this detailed description.

BRIEF DESCRIPTION OF DRAWINGS

The present invention will be more clearly understood and further applications will be apparent when reference is made to the following detailed descriptions of the preferred embodiments of the invention which are given by way of illustration only, and thus are not limitative of the present invention, and wherein.

The above, and other objects, features and advantages of the present invitation will become apparent from the following description read in conjunction with the accompanying drawings.

DESCRIPTION OF PREFERRED EMBODIMENTS

The preferred embodiments are directed to a new type of nanophotonic materials, devices and integrated nanophotonic circuits for both classical and quantum optical signal processing, including optical quantum computing, transmission and generation of light. A key element of the preferred embodiments of nanophotonic devices is a waveguide made of quantum systems embedded in a frequency bandgap medium, provided that the transition frequency of at least one of the optical transitions of the quantum systems lies inside the photonic bandgap of the frequency bandgap medium. The present invention will be more clearly understood and further applications will be apparent when detailed descriptions of preferred embodiments of the invention are made for a specific realization of the invention based on semiconductor quantum dots embedded in photonic crystals (photonic bandgap materials). Moreover, making use of the quantum dots for practical implementation of quantum system waveguides has an essential advantage, because, in quantum dots coupling between optical transitions and phonon (vibration) modes is depressed due to a nanoscale size of quantum dots. That results in reducing nonradiative recombination, and hence, in reducing losses in the proposed waveguides. Moreover, capping the quantum dot with a shell made of appropriate inorganic or organic materials essentially reduces nonradiative recombination occurring at the surface of quantum dot.

Figure 1:
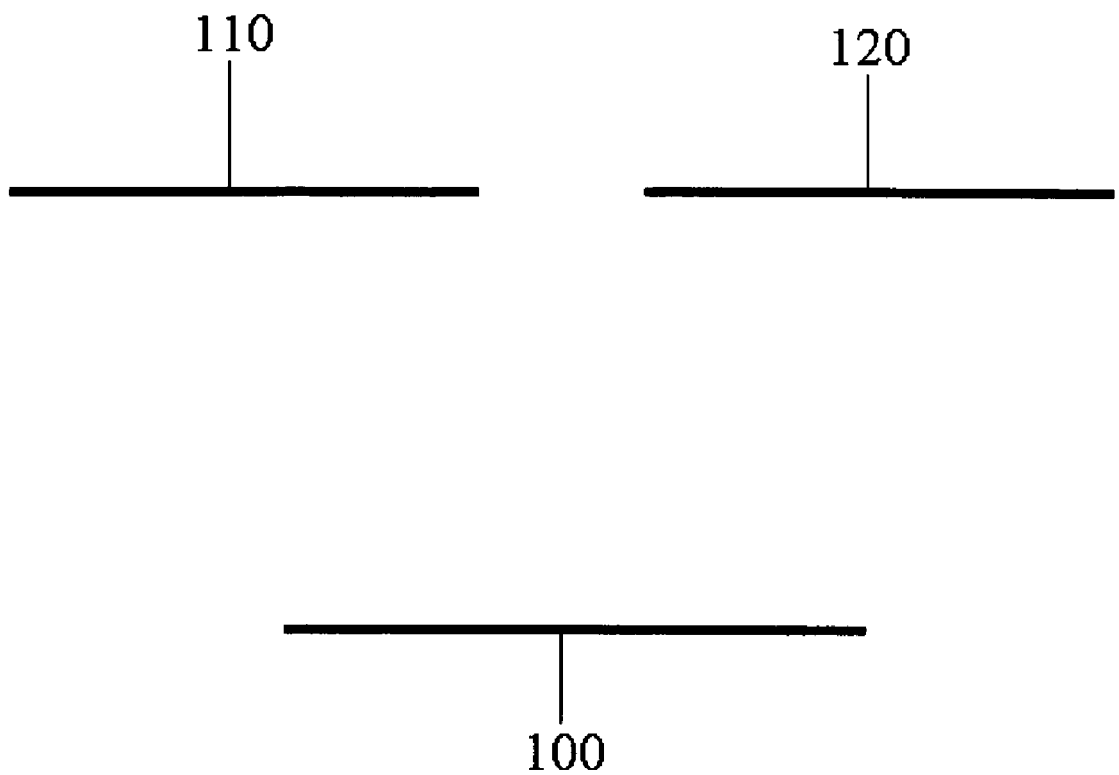
FIG. 1 illustrates the energy level structure of a semiconductor quantum dot.

FIG. 1 illustrates the energy level structure of a semiconductor quantum dot. The ground state 100 with energy $E_{ground}$ is occupied by two electrons with different spins, while two excited (excitonic) degenerate states 110 and 120 with energy $E_{excited}$ are empty. If a right polarized photon with the frequency close to the transition frequency $\Omega = (E_{excited} - E_{ground})/\hbar$ (where $\hbar$ is the Plank constant) is absorbed, one of the electrons is transferred from the ground state to, say, the excited state 120. Absorption of a left-polarized photon results in an electron transfer from the ground state to the excited state 110. So called biexciton state (not shown in the figure), corresponding to excitation of two electrons from the ground state is essentially shifted from the double frequency $2\Omega$, therefore in the vicinity of the resonance frequency $\Omega$ the quantum dots can be treated as two-level quantum systems.

In vacuum or in a conventional optical material, the excited states have a finite lifetime, because the excited states decay into propagating radiation modes, and an electron returns from the excited state to the ground one. For example, the spontaneous decay lifetime, $\tau_{SD}$, in the case of CdTe and CdSe quantum dots operating in visible range is on nanosecond scale, while for PbSe quantum dots operating in the near infrared range of spectrum it is on picosecond scale. Correspondingly, the rate of the spontaneous decay, $\Gamma \sim \hbar/\tau_{SD}$, which characterizes the strength of coupling between light and the optical transition in quantum dots, ranges between 0.005 cm$_{-1}$ (for $\tau_{SD} \sim 1$ ns) and 5 cm$^{-1}$ (for $\tau_{SD} \sim 1$ ps). The situation drastically changes for a quantum dot embedded in a photonic crystal, provided that the optical transition frequency $\Omega$ lies inside the frequency bandgap of the photonic crystal. For the optical transition lying inside the bandgap, spontaneous decay into propagating photon modes is completely suppressed, and the photon and quantum dot form a photon-quantum dot bound state, in which radiation is localized in the vicinity of the quantum dot in the volume $V \sim \Lambda^3$, where $\Lambda$ is the wavelength corresponding to the transition frequency $\Omega$, $\Lambda = 2\pi c/\Omega$, and c is the speed of light in vacuum.

It is clear that the existence of a photonic bandgap in the spectrum of elementary electromagnetic excitations of a medium, at least in one of the directions of photon propagation, as for example it occurs in one-dimensional Bragg gratings, plays a crucial role in the present invention. For practical implementations of the invention, one can use any medium exhibiting the gapped photonic spectrum, such as 1D, 2D and 3D artificial photonic bandgap materials, ionic crystals, molecular materials, including molecular crystals, liquids, polymers, and semiconductors.

Figure 2:
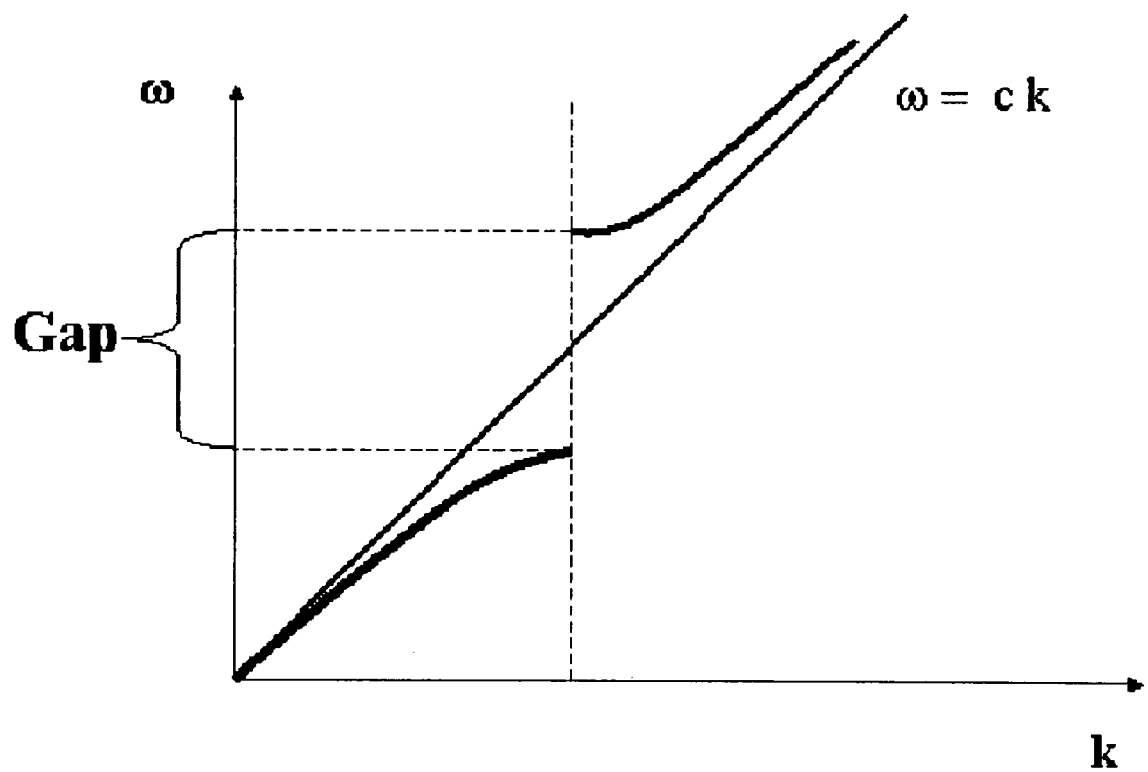
FIG. 2 schematically illustrates typical spectrum of propagating electromagnetic modes in the photonic crystals.

FIG. 2 illustrates the gapped spectrum of elementary electromagnetic excitations of a photonic bandgap material.

In the case of artificial photonic bandgap materials the photonic bandgap results from a spatially periodic structure of dielectric permeability of the medium. In natural frequency bandgap media, such as ionic crystals (for example, NaCl, LiH, LiF, SiC, AgBr, AgCl), molecular crystals (for example, anthracene, naphthalene, diphenylacetylene) or semiconductor materials (for example, CdS, CdSe, ZnSe, InP, Si, Ge), the photonic bandgap results from coupling between photons and optically active excitations of the medium. In the case of ionic crystals, coupling of the photons to optically active vibrations of ions (optical phonons) results in a photonic bandgap for propagating photons, or, in other words, in polaritonic splitting of the spectrum. In the case of molecular crystals or molecular liquids, photons are coupled to electronic intermolecular excitations, or Frenkel excitons. In the case of semiconductor materials, the photonic bandgap results from the coupling of photons to Wannier-Mott excitons. Thus, all these frequency bandgap materials together cover, in terms of position of the photonic bandgap, a wide range of frequencies from ultraviolet to far infrared. Therefore, the nanophotonic devices based on the present invention can be designed for operation in practically all ranges of optical frequencies—from ultraviolet to far infrared.

Figure 3:
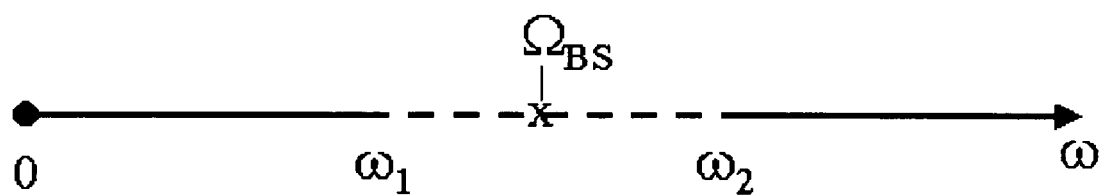
FIG. 3 illustrates the spectrum of elementary electromagnetic excitations of a frequency bandgap medium containing a quantum dot with the working transition lying inside the photonic bandgap.

FIG. 3 illustrates the spectrum of elementary electromagnetic excitations of the frequency bandgap medium containing a quantum dot. The bandgap for propagating radiation modes is extended between the frequencies labeled by $\omega_1$ and $\omega_2$. The eigenfrequency of the photon-quantum dot bound state $\Omega_{BS}$ lies inside the bandgap, $\omega_1 < \Omega_{BS} < \omega_2$. Because the eigenfrequency of bound state is very close to the transition frequency $\Omega$, $\Omega_{BS} \approx \Omega$, hereafter we do not distinguish these two values. Since optical transition in the quantum dot is degenerate with respect to two different (left and right) polarizations of photons coupled to the optical transition, the bound state is also twice degenerate with respect to polarization.

If two identical quantum dots are located sufficiently close to each other, on the distance less or compared to the characteristic size of the bound state, the bound state can tunnel from one quantum dot to another and back. In other words, for two identical quantum dots located sufficiently close to each other, the bound state is delocalized and a bound photon can be found with equal probabilities in the vicinity of any of these quantum dots.

Figure 4:
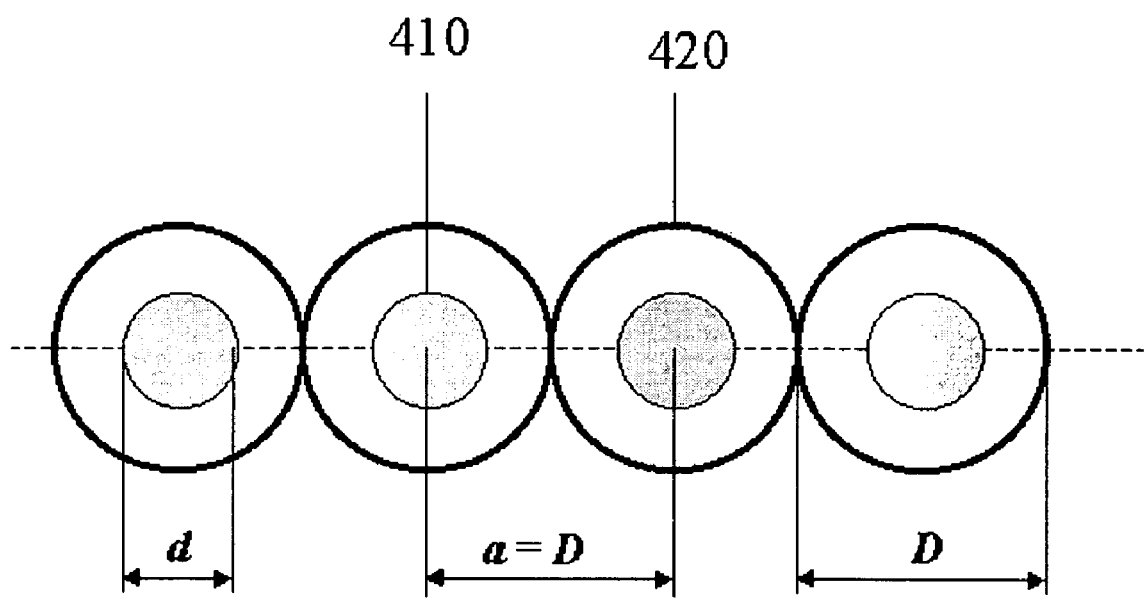
FIG. 4 illustrates a close packed chain waveguide made of core-shell quantum dots.

FIG. 4 illustrates one of the preferred embodiments of a key element of nanophotonic devices of the present invention—a quantum dot waveguide. Here, the quantum dot waveguide comprises a spatially ordered periodic chain of quantum dots embedded in a photonic crystal. The illustrated embodiment employs so-called core-shell quantum dots. The semiconductor core 410 having diameter d determines optical parameters of the working transition. To obtain frequency of the working transition in the optical range of spectrum, one needs to use the core with nanoscale diameter. The shell 420 made of optically transparent materials, such as a polymer or a wide bandgap semiconductor, has diameter D, which determines period of a close packed chain a=D.

If identical quantum dots are arranged in a spatially ordered periodic chain, then the bound states corresponding to different quantum dots are completely delocalized forming a photonic bandgap lying inside photonic bandgap of the frequency bandgap medium. Photons with frequencies lying inside the passband—the passband photons—can freely propagate along the waveguide.

Figure 5:
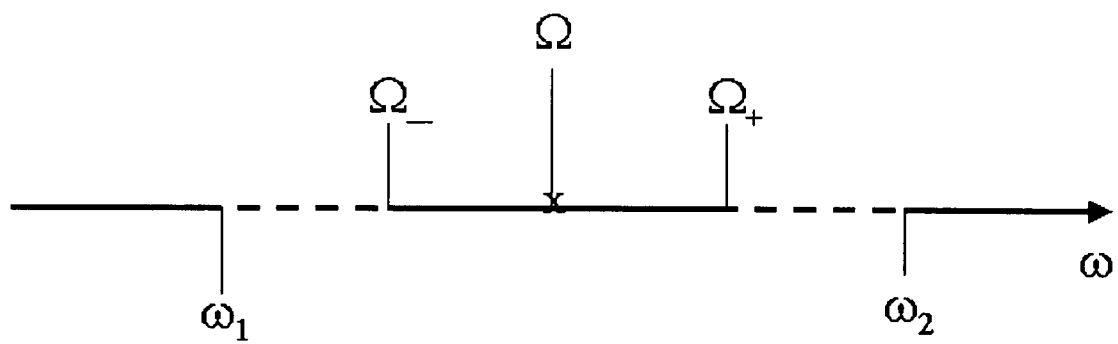
FIG. 5 illustrates the spectrum of elementary electromagnetic excitations of a frequency bandgap medium crystal containing a periodically ordered chain of quantum dots.

FIG. 5 illustrates spectrum of the photonic crystal containing a periodic chain of quantum dots. The photonic passband extends inside the photonic crystal bandgap between frequencies labeled by $\Omega_-$ and $\Omega_+$. If one takes into account tunneling of the photon-quantum dot bound state only between nearest neighbor quantum dots, then simplest computations within the framework of the tight-binding model give the following expression for the spectrum of passband photons: $\omega(k) = \Omega - 2t \cos(ka)$, where k is the photon wave vector along the chain lying in the first Brillion zone, $-\pi/a < k < \pi/a$, and t is the probability amplitude of tunneling between nearest neighbor quantum dots in the chain, which is mainly determined by period of the chain a. In the tight-binding model the photonic passband of width $\Delta = 4t$ extends between frequencies $\Omega_- = \Omega - 2t$ and $\Omega_+ = \Omega + 2t$. The probability amplitude of tunneling t is estimated as $t \sim \Lambda/(a/\Lambda)^3$ due to dipole-dipole interdot coupling for $a << \Lambda$. Therefore, a desired width of the photonic passband can be easily controlled by an appropriate choice of the period of the chain. Even at $\Gamma \sim 0.005$ cm$^{-1}$, corresponding to the spontaneous lifetime $\tau_{SD} \sim 1$ ns the width of photonic passband approaches $\Delta \sim 20$ cm$^{-1}$ already at $a/\Lambda \sim 0.1$. The group velocity of passband light pulses propagating along the chain $V_{group} = d\omega(k)/dk$ is also determined mainly by the period of the chain. That allows fabrication of high efficiency lines of delay from the periodic chains of quantum dots embedded in photonic crystals.

Because the passband photons can propagate only along the quantum dot chain and the photon modes with passband frequencies cannot propagate in the photonic crystal, bending losses in the system should be very low, as it occurs also in cavity waveguides in photonic crystals. Therefore, the quantum dot chain can be bent practically with any curvature. That allows fabrication of extremely compact quantum dot waveguide structures and nanophotonic circuits.

Despite the fact that size of quantum dots having a working transition in the optical range of frequencies lies on nanometer scale, characteristic size of the photon-quantum dot bound state, and hence characteristic spatial size of the passband modes, lies on micrometer scale corresponding to characteristic wavelength of the working transition $\Lambda$. It means that passband modes of quantum dot waveguides can be easily coupled with the propagation modes of conventional fibers and waveguides. That allows achieving optical coupling with low insertion loss between the quantum dot waveguides and conventional fibers and waveguides used in telecommunications industry.

Another preferred embodiment of the quantum dot waveguides employs a disordered but sufficiently dense system of quantum dots, in which average interdot spacing is much less than characteristic wavelength $\Lambda$ of the working transition. Such an embodiment works even for a quantum dot system with large inhomogeneous broadening of the working transition, $\Gamma_{IN}$, provided the number of "identical" quantum dots, N, with the transition frequencies lying inside $\Gamma$ in the volume under the tunneling length, $V \sim \Lambda^3$, $N \sim C^{QD} \Lambda^3 (\Gamma/\Gamma_{IN})$, (where $C_{QD}$ is the density of such quantum dots) is sufficiently large, i.e. $N >> 1$. In the disordered but sufficiently dense quantum dot waveguides, wave functions of the photon-quantum dot bound states corresponding to "identical" quantum dots overlap each other very well. Therefore, the dense system of quantum dots can be treated as a continuous optical resonance medium developing the inhomogeneously broadened photonic passband inside photonic bandgap of the photonic crystal.

In quasi-one-dimensional ordered or disordered waveguides, the photonic passband is also one-dimensional, in which passband photons propagate only along a waveguide. It is clear that two- and three-dimensional ordered or disordered optically dense structures made of quantum dots embedded in the photonic crystal would develop two- and three-dimensional photonic passbands, respectively. For example, quantum dots concentrated in two-dimensional layer or in thin film inside the photonic crystal develop a two-dimensional photonic passband, in which passband photons propagate along any direction in this layer.

Correspondingly, an ordered three-dimensional lattice made of quantum dots develops a three-dimensional photonic passband lying inside photonic bandgap of the photonic crystal. It is clear that the three-dimensional photonic passband can be also developed in a photonic crystal doped with spatially disordered quantum systems with an inhomogeneously broadened working transition provided the sufficiently high density of quantum systems in the volume of photonic crystal.

A complete suppression or even partial depression of radiative decay of the working transition of a quantum system in photonic crystals plays a very important role for developing optically active media for light amplification and lasing. It is clear that in such composite media, the rate of radiative decay of the excited state of the working transition into passband photons can be easily controlled by an appropriate choice of physical and optical parameters of both photonic crystals and quantum systems. Therefore, one can create inversion of population in the upper energy state of the working transition, for which it is impossible to do in vacuum or in conventional optical materials because of too fast radiative decay of the transition.

Because one quantum dot cannot be excited twice by a resonance photon, the passband photons cannot be localized simultaneously on the same quantum dot. That results in extremely strong interaction between passband photons propagating inside one quantum dot waveguide or in different quantum dot waveguides located sufficiently close to each other. Therefore, in sharp contrast to conventional waveguides in photonic crystals made from optically passive cavities, the proposed quantum dot waveguides and their structures made from optically active quantum systems exhibit unique nonlinear optical properties that can be used for development of all-optical nanostructured materials, devices and circuits, in which light signal is controlled by another light.

Moreover, due to the sufficiently strong quantum-confined Stark effect in quantum dots, an applied electric field can easily control transition frequency of the working transition, and thus control passband light signals propagating in the quantum dot waveguide. Therefore, one can design the nanophotonic devices, in which light signals propagating in the quantum dot waveguide are controlled by the electric filed, applied to at least one of the quantum dots in this waveguide. It is also clear that the quantum dot waveguide structures can be used for design of efficient electro-optic nano-devices converting the electrical signals into optical. Some basic nanophotonic devices based on the quantum dot waveguides in photonic crystals are illustrated below.

Figure 6:
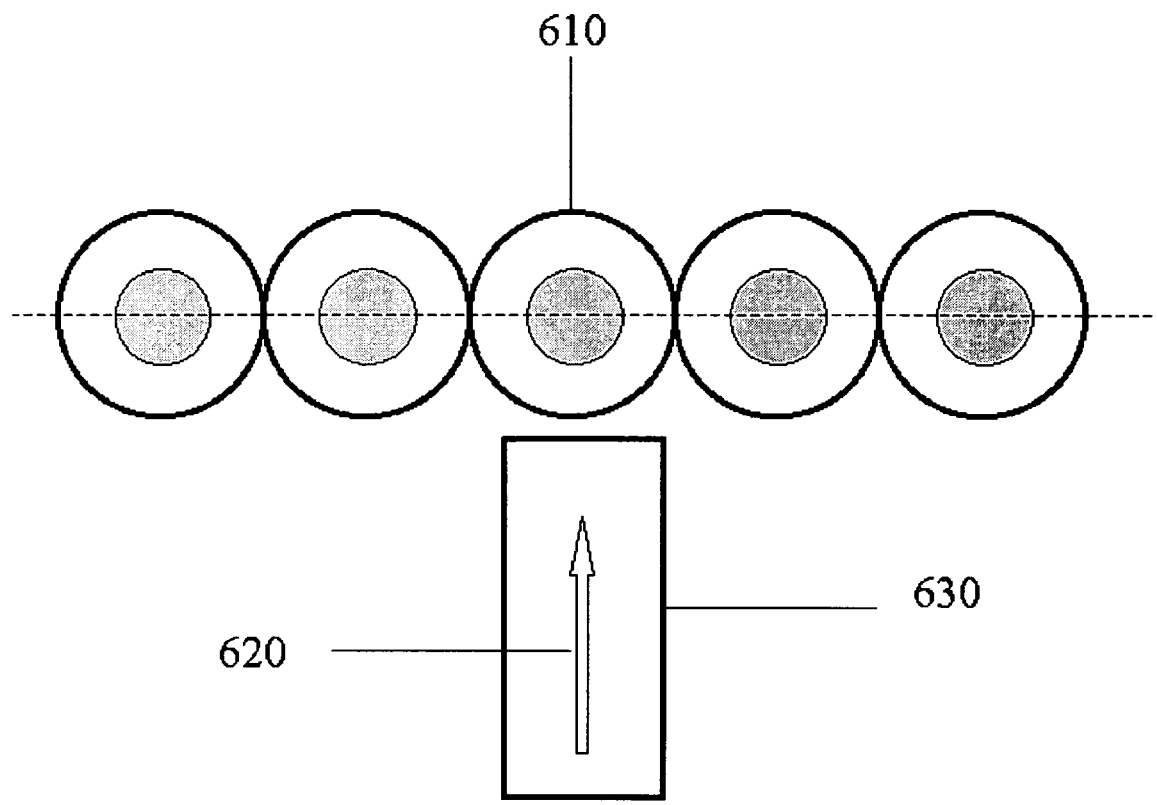
FIG. 6 illustrates a section of a close packed core-shell quantum dot waveguide performing the functions of all-optical switch, modulator, or transistor.

FIG. 6 shows a section of the close packed core-shell quantum dot waveguide performing the functions of all-optical switch, modulator, or transistor. Here, population of the working transition of at least one "control" quantum dot 610 of the quantum dot waveguide, and hence light signal propagation in the waveguide, is controlled by a control light signal 620 delivered through an ordinary waveguide or fiber 630. An electric field applied to at least one quantum dot in the waveguide can also perform function of the control signal. Due to an analog of the Stark effect in the quantum dots, the applied electric field shifts the working transition frequency and thus changes the intensity of passband light signal propagating in the quantum dot waveguide. That allows developing efficient electro-optical converters, in which the propagation of passband light is controlled by an external electric filed.

If both the input and the control optical signals are represented by coherent light pulses that are chosen to be much shorter than characteristic dephasing time of working transition in the quantum systems, then the device shown in FIG. 5 operates as a quantum all-optical modulator or transistor. If the coherent control light pulse excites the control quantum dot in a coherent superposition of its ground and excited states, $|CS\rangle = \alpha|\text{ground}\rangle + \beta|\text{excited}\rangle$, where $\alpha$ and $\beta$ are the complex probability amplitudes of finding the control quantum dot in the ground and excited state, respectively, and $|\alpha|^2 + |\beta|^2 = 1$, then the transmitted and reflected coherent optical pulses propagating in the quantum dot waveguide contain information about the complex probability amplitudes $\alpha$ and $\beta$ rather than only about the population of the excited state $|\beta|^2$, as it occurs in the case of classical signal processing with incoherent light pulses. It is also clear that the proposed all-optical quantum modulator or transistor can operate as a quantum control-NOT logic gate, which is a key element for design of all the quantum logic gates required for quantum computing.

Figure 7:
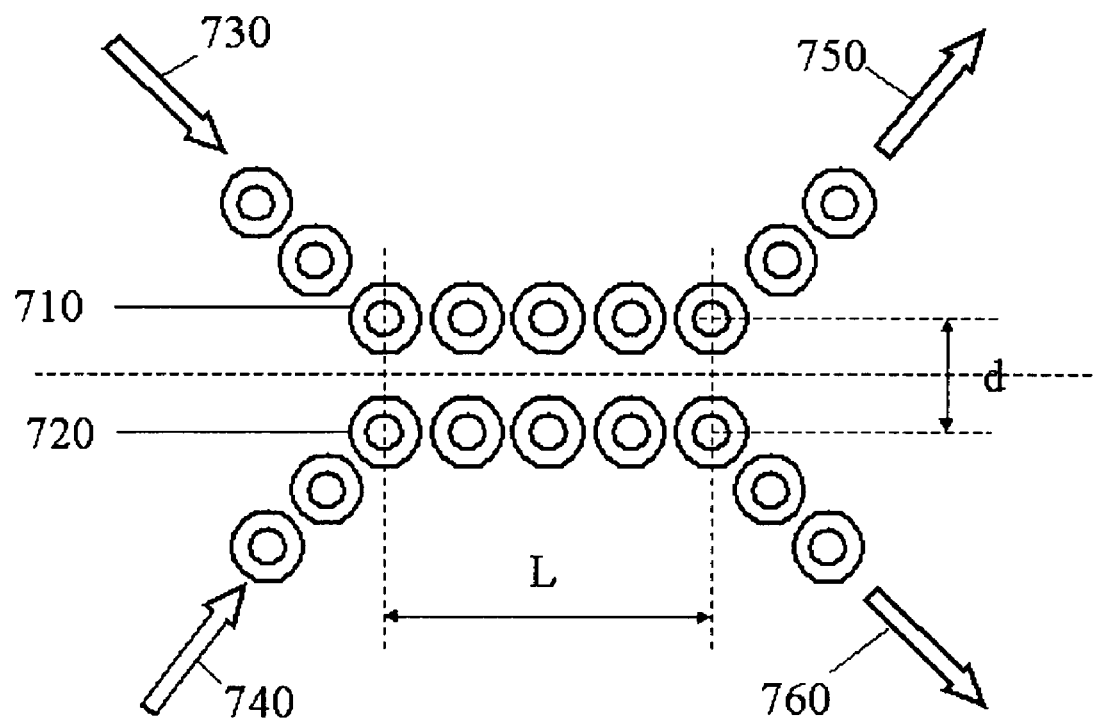
FIG. 7 illustrates a nanophotonic device that operates as a nonlinear directional coupler, or a generator of entangled photon states.

FIG. 7 illustrates a nanophotonic device, which operates as a nonlinear directional coupler. The coupler comprises two arms 710 and 720 made of quantum dot waveguides. In the case of conventional linear directional coupler, the intensities of the output signals 750 and 760 are determined by spectral characteristics of the waveguides, coupling length L, and by separation d between arms of the coupler, and do not depend on the intensities of the input signals 730 and 740. However, if the arms of the coupler are made of quantum dot waveguides exhibiting strong nonlinear optical properties, the intensities of the output signals depend also on intensities of the input signals. Thus, an appropriate choice of the input signals allows control of the distribution of intensities of strongly correlated output signals in the nonlinear directional coupler.

Since photons propagating in different arms of the directional coupler strongly interact with each other, the output photons are strongly quantum-mechanically correlated to each other. Therefore, the nanophotonic device illustrated in FIG. 7 can be used as an extremely high efficiency generator of entangled photons, which could be employed, for example, in quantum key distribution devices for unbreakable quantum communication lines. Moreover, because the strong photon-photon interaction occurs between input photons of different polarizations propagating in the arms of the generator, the output photons are strongly entangled also in their polarization.

Figure 8:
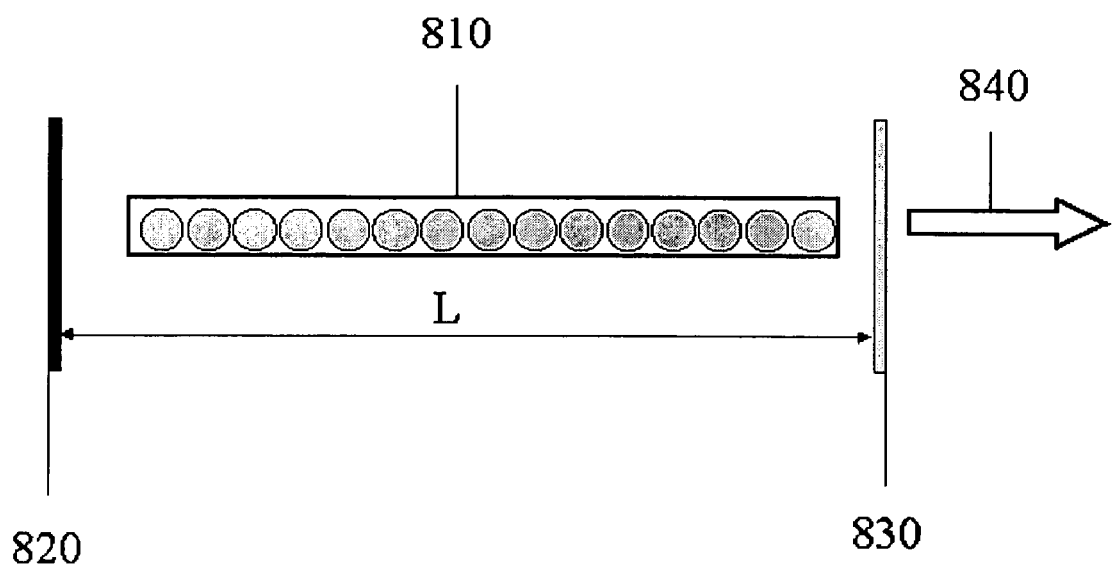
FIG. 8 illustrates the simplest possible design of a quantum dot waveguide laser generating passband photons.

In addition to transmission and processing of light signals, the quantum system structures embedded in a photonic crystal can be used as an active media for amplification of the passband light signals and lasing. FIG. 8 illustrates the simplest design of a laser employing the passband photons in a photonic bandgap medium. It comprises a quantum dot waveguide 810 acting as an active medium, and a resonator of length L having a completely reflecting mirror 820 and a semi-transparent mirror 830. The working transition of the quantum dots is pumped either electrically or optically through upper excited states as in conventional optically pumped lasers. Because in a photonic crystal the only channel for decay of the working transition is emission of the passband photons propagating along the waveguide, the quantum dot active medium generates passband radiation 840 in a narrow angle and at very low threshold. It is clear that such an active medium can be used in many different geometries and designs of lasers.

A pumped quantum dot waveguide can be also used for amplification of a week input passband signal. As in the case of lasing, efficiency of the amplification is very high, because the working transition decays only into passband modes.

Thus, the quantum system structures in frequency bandgap media described in the present invention can be used for designing both nanophotonic signal processing devices, including all-optical devices where light is controlled by light, and active nanophotonic elements, such as lasers and amplifiers. If length of passband pulses is much shorter than characteristic dephasing time in the quantum systems, then the proposed structures can also be used for optical quantum information processing, where the preserving of phase memory plays an extremely important role.

Having described preferred embodiments of the invention with reference to the accompanying drawings, it is to be understood that the invention is not limited to the precise embodiments, and that various changes and modifications may be effected therein by skilled in the art without departing from the scope or spirit of the invention as defined in the appended claims.

What is claimed is:

1. A nonlinear optical and electro-optical material for optical signal processing, spectral and spatial filtering, light amplification or generation comprising a frequency bandgap medium exhibiting at least one photonic bandgap forbidden for electromagnetic modes of the light propagating in at least one direction, a set of quantum systems including at least one atom, molecule or quantum dot having at least two degenerate or non-degenerate discrete energy levels with at least one working transition between the energy levels interacting with the light, wherein said set of quantum systems is embedded into said frequency bandgap medium, and frequency of said at least one working transitions between the energy levels of the quantum systems lies inside the said photonic gap of the frequency bandgap medium developing a photonic passband inside the photonic bandgap and ensuring efficient suppression of spontaneous decay of the upper energy state of the working transition.

2. An active optical material for light amplification and lasing of claim 1, wherein the developed photonic passband is chosen such to achieve the rate of radiation decay of the excited state of the working transition required for creation of efficient inversion of population in the upper energy state of the working transition.

3. A device for optical signal processing, transmission or generation comprising at least one input optical signal port;
at least one output optical signal port;
at least one optional control port;
a set of quantum systems including at least one atom, molecule or quantum dot having at least two degenerate or non-degenerate discrete energy levels with at least one working transition between the energy levels interacting with the optical signals;

a frequency bandgap medium exhibiting at least one photonic bandgap forbidden for electromagnetic modes of the optical signal propagating in at least one direction, wherein said set of quantum systems is embedded into said frequency bandgap medium, and frequency of said at least one working transitions between the energy levels of the quantum systems lies inside the said photonic bandgap of the frequency bandgap medium developing a phonic passband inside the photonic bandgap and ensuring efficient suppression of spontaneous decay of the upper energy state of the working transition.

4. A device for optical signal processing, transmission or generation of claim 3, comprising a wire-like spatially ordered or disordered structure of the quantum systems forming a quantum system waveguide.

5. A device for optical signal processing, transmission or generation of claim 3, wherein said quantum systems comprise of either semiconductor quantum dots having confined conduction band energy level and confined valence band energy level, and each of said at least two confined energy levels are capable of being populated with at least one charge carrier or metal quantum dots having at least two confined energy levels due to geometrical quantization.

6. A quantum system waveguide of claim 4, comprising a chain of close packed core-shell quantum dots each having the quantum dot core surrounded with a shell made from another optical material transparent in the vicinity of the working transition of the core quantum dot, such as a polymer or a semiconductor with wider bandgap, wherein core diameter of the core-shell quantum dot determines the energy level structure of the quantum dot, while the diameter of the shell determines interdot spacing and hence the spatial period of the quantum dot chain waveguide.

7. A device for optical signal processing, transmission or generation of claim 3, wherein the photonic bandgap medium is an artificial photonic crystal, in which the density of propagating radiation modes in the vicinity of working transition is essentially suppressed in at least one of the directions of light propagation.

8. A device for optical signal processing, transmission or generation of claim 3, wherein the photonic bandgap medium is an ionic crystal, a molecular crystal, a semiconductor material, or any other optical material exhibiting a gapped or pseudo-gapped frequency spectrum of elementary electromagnetic excitations, in which the density of propagating radiation modes in the vicinity of working transition is essentially suppressed in at least one of the directions of light propagation.

9. A quantum system waveguide of claim 4 operating as a line of delay of optical pulses, wherein spacing between quantum systems is chosen such to provide the required group velocity of passband light pulses propagating along the quantum system waveguide.

10. A quantum system waveguide of claim 4 performing the functions of all-optical switch, modulator, transistor or control-NOT logic gate, wherein optical signal in said at least one control port changes population of the discrete energy levels of the working transition in at least one of the quantum systems of the quantum system waveguide to control the optical signals propagating along the waveguide.

11. A quantum system waveguide of claim 4 performing the functions an electro-optical switch, modulator, transistor, control-NOT logic gate or converter of electrical signals into light signals, wherein an electrical control signal in said at least one control port is applied to at least one of the quantum systems of the quantum system waveguide changing frequency of the working transition of the quantum system due to shift of energy levels in the quantum system (Stark effect) to control the optical signals propagating along the waveguide.

12. A nonlinear directional coupler comprising at least two quantum system waveguides of claim 4, wherein separation between said quantum system waveguides and intensities of the input optical signals are selected such to ensure the required coupling between signals propagating in the quantum signal waveguides, splitting of the input signal between the quantum system waveguides or coupling of the propagating signals from one quantum system waveguide to another.

13. A device for optical signal processing, transmission or generation of claim 3, wherein optical signals are coherent light pulses that are chosen to be much shorter than the characteristic dephasing time of the working transitions in the quantum systems embedded in the photonic bandgap medium in order to perform quantum optical signal processing.

14. An optical switch, modulator, or transistor of claim 10, wherein optical signals are coherent light pulses that are chosen to be much shorter than the characteristic dephasing time of the working transitions in the quantum systems embedded in the photonic bandgap medium in order to perform quantum optical signal processing.

15. An optical switch, modulator, or transistor of claim 11, wherein optical signals are coherent light pulses that are chosen to be much shorter than the characteristic dephasing time of the working transitions in the quantum systems embedded in the photonic bandgap medium in order to perform quantum optical signal processing.

16. A nonlinear directional coupler of claim 12, wherein optical signals are coherent light pulses that are chosen to be much shorter than the characteristic dephasing time of the working transitions in the quantum systems embedded in the photonic bandgap medium in order to perform quantum optical signal processing.

17. A nonlinear directional coupler of claim 12 performing functions of a generator of entangled states of photons, wherein optical signals are coherent light pulses that are chosen to be much shorter than the characteristic dephasing time of the working transitions in the quantum systems embedded in the photonic bandgap medium.

18. A generator of entangled states of photons of claim 17, wherein input light signals in the quantum nonlinear directional coupler have different polarizations to generate the photons entangled in polarization.

19. An optical amplifier based on the quantum system waveguide of claim 4, wherein said at least one quantum system waveguide is pumped either electrically or optically to create inversion of population, and the light signal propagating in the pumped quantum system waveguide is amplified due to stimulated emission of excitations of the quantum systems into passband photons of the quantum system waveguide.

20. A laser based on the quantum system waveguide of claim 4, wherein said input optical signal port is absent, the quantum system waveguide is pumped either electrically or optically to create inversion of population, the light signal propagating in the pumped quantum system waveguide is amplified due to stimulated emission of excitations of the quantum systems into passband photons of the quantum system waveguide, and the quantum system waveguide has a means creating a feedback for the passband photons resulting in generation of coherent light.

* * * * *